(12) United States Patent
Booth et al.

(10) Patent No.: US 8,968,838 B2
(45) Date of Patent: Mar. 3, 2015

(54) PLASMA PROCESSING IN A CAPACITIVELY-COUPLED REACTOR WITH TRAPEZOIDAL-WAVEFORM EXCITATION

(75) Inventors: Jean-Paul Booth, Boullay les Troux (FR); Erik Johnson, Paris (FR)

(73) Assignees: Ecole Polytechnique, Palaiseau (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/809,784

(22) PCT Filed: Jul. 12, 2011

(86) PCT No.: PCT/EP2011/061894
§ 371 (c)(1),
(2), (4) Date: Jan. 11, 2013

(87) PCT Pub. No.: WO2012/007483
PCT Pub. Date: Jan. 19, 2012

(65) Prior Publication Data
US 2013/0136872 A1 May 30, 2013

(30) Foreign Application Priority Data
Jul. 15, 2010 (EP) .................................. 10169735

(51) Int. Cl.
*C23C 16/509* (2006.01)
*H01J 37/32* (2006.01)

(52) U.S. Cl.
CPC ......... *C23C 16/509* (2013.01); *H01J 37/32091* (2013.01); *H01J 2237/3348* (2013.01)

USPC ....................................... 427/569; 118/723 E

(58) Field of Classification Search
None
See application file for complete search history.

(56) References Cited

U.S. PATENT DOCUMENTS

| 2002/0090815 | A1 | 7/2002 | Koike et al. |
| 2005/0011748 | A1* | 1/2005 | Beck et al. ............... 204/192.12 |
| 2005/0241762 | A1 | 11/2005 | Paterson |
| 2008/0057222 | A1 | 3/2008 | Ui |
| 2009/0255800 | A1 | 10/2009 | Koshimizu |
| 2012/0048831 | A1* | 3/2012 | Rueger ............................ 216/67 |

FOREIGN PATENT DOCUMENTS

WO 2009/115135 9/2009

OTHER PUBLICATIONS

E. Kawamura et al., "Ion Energy Distributions in RF Sheaths; Review, Analysis and Simulation", Plasma Sources Science and Technology, vol. 8, 1999, pp. R-45-R64.
(Continued)

*Primary Examiner* — Joseph Miller, Jr.
(74) *Attorney, Agent, or Firm* — Greer, Burns & Crain, Ltd.

(57) ABSTRACT

A method is provided for exciting at least one electrode of a capacitively coupled reactive plasma reactor containing a substrate. The electrode is excited by applying a RF voltage with a trapezoidal waveform comprising a ramp-up, a high plateau, a ramp-down and a low plateau. The plasma density can be controlled by adjusting the duration of the ramp-up, the duration of the ramp-down, the amplitude and the repetition rate of the trapezoidal waveform. The ion energy distribution function at the substrate can be controlled by adjusting the amplitude and the relative duration between the high plateau and the low plateau of the trapezoidal waveform.

14 Claims, 3 Drawing Sheets

(56) References Cited

OTHER PUBLICATIONS

E Kawamura et al., "Ion Energy Distributions in RF Sheaths; Review, Analysis and Simulation", The Institution of Electrical Engineers, Aug. 1999, Database inspection C:/EPOPROGS/SEA\.\...\...\epodata\sea\eplogf\internal.log.

M.M Patterson, "Arbitrary Substrate Voltage Wave Forms for Manipulating Energy Distribution of Bombarding Ions During Plasma Processing", Plasma Sources Science and Technology, vol. 16, 2007, pp. 257-264.

Shahid Rauf, "Effect of Bias Voltage Waveform on Ion Energy Distribution", Journal of Applied Physics, vol. 87, No. 11, Jun. 1, 2000, pp. 2647-2651.

* cited by examiner

PLASMA PROCESSING IN A CAPACITIVELY-COUPLED REACTOR WITH TRAPEZOIDAL-WAVEFORM EXCITATION

BACKGROUND OF THE INVENTION

A method and system are disclosed for exciting at least one electrode of a capacitively coupled reactive plasma reactor containing a substrate.

The present invention may advantageously be applied to:
Plasma-enhanced Chemical Vapour Deposition (PECVD) of thin films, for example of amorphous, micro- and nano-crystalline alloy of silicon and/or germanium and/or carbon for photovoltaic solar cell manufacture; also deposition of other thin films such as $SiO_2$, $Si_3N_4$ etc for flat-panel display and integrated circuit manufacture;
Plasma etching of thin films, including Si, $SiO_2$, $Si_3N_4$, metals etc for FPD manufacture, integrated circuit manufacture, photonic device manufacture; and
Other plasma surface modification processes such as ion implantation, surface modification, hardening etc...

In general, parallel-plate reactors excited by capacitively-coupled radio-frequency (RF) power, with frequency from 0.1 to 200 MHz for example, are widely employed for depositing, etching and modifying thin films in domains including microelectronics and solar panel manufacture.

In large-area plasma processing (deposition or etching) of substrates in parallel-plate capacitive plasma reactors using conventional sinusoidal excitation, the plasma density and therefore the deposition or etch rate, can only be increased by increasing the applied radiofrequency voltage. This simultaneously increases the average energy of ions striking the substrate. In many applications, such as PECVD of silicon thin films, excessive ion energy damages the substrate or deposited film, so that only low voltages can be used, resulting in limited processing rates. Furthermore, the shape of the ion energy distribution function (IEDF) in conventional sinusoidally excited reactors is complex, typically saddle-shaped, and cannot be controlled.

Historically, sinusoidal waveforms have been used, first single frequency, and more recently two or three-frequency, but without synchronization of the different generators. Optimal processing of the substrate requires complete control of the energy of ions arriving at its surface, independent of the ion flux. For example, for etching high ion energies are needed, whereas for silicon deposition the ion energy must be kept below a threshold value around tens of electron volts.

Some independent control of ion flux and energy has been achieved by varying the RF frequency: at higher frequency the sheath impedance is lower, giving higher plasma densities, higher ion fluxes and lower ion energies for a given RF input power. However, in a symmetrical reactor, which has parallel electrodes of equal area, the equivalence of the sheaths in front of the two electrodes remains, so that both electrodes have equal ion bombardment. Further problems occur in large area high-frequency reactors due to standing wave effects, causing non-uniform processing across the wafer.

Document WO 2009/115135 proposes that by using two frequencies f+2f, of equal voltage amplitude the symmetry of the sheaths is broken, and the division of the voltage between the two sheaths should be continuously controllable by varying the phase delay between the two frequencies, allowing control of the ion energy at each surface.

In Patterson, M. M., H.Y. Chu, and A. E. Wendt, "*Arbitrary substrate voltage wave forms for manipulating energy distribution of bombarding ions during plasma processing.*"; Plasma Sources Science & Technology, 2007. 16(2): p. 257-264, the authors disclose that the control of ion energy distribution at a substrate in a decoupled plasma source such as an inductively coupled plasma (ICP) or helicon can be achieved by tailoring the wave form shape of a radio-frequency bias applied to the substrate, using a programmable waveform generator in combination with a power amplifier.

The present invention proposes to improve prior art techniques with simultaneous plasma generation in a parallel plate reactor and control of the Ion Energy Distribution Functions (IEDF), either mono-energetic or more complex, for better optimization of plasma etch and deposition processes.

An object of the present invention is an application of an electrical asymmetry effect in a capacitively coupled reactive plasma reactor.

Another object of the present invention is a complete control of the growth mode of thin films deposited at low temperature.

SUMMARY OF THE INVENTION

In at least preferred embodiments, the present invention provides a method for exciting at least one electrode of a capacitively coupled reactive plasma reactor containing a substrate. According to the invention:
the electrode is excited by applying a RF voltage with a trapezoidal waveform, and
the plasma density and fluxes of ionic and neutral species to a substrate are controlled by adjusting the duration of the ramp-up and/or the duration of the ramp-down of the trapezoidal waveform.

The plasma according to the present invention can be created and maintained with a controllable periodic trapezoidal waveform.

According to the present invention, trapezoidal waveform means a signal having a realizable approximation form of a trapezoid. Said trapezoidal waveform preferably comprises a ramp-up, a high plateau, a ramp-down and a low plateau.

The present invention provides a plasma excitation method using non-sinusoidal waveforms to decouple (i.e. to independently control) the plasma density and fluxes of ion and neutral reactive species from the ion bombardment energy.

In other words, the technique proposed by the present invention allows decoupling of plasma density control from ion energy control, allowing the highest possible particle fluxes to the substrate (highest processing rates) with the lowest ion energies, and gives great flexibility in the control of the ion energy distribution at the substrate, i.e. an optimal process quality. Numerous applications in both plasma deposition and etch processes will benefit. Furthermore such a control of ion energy to specific surfaces of the reactor allows optimal plasma cleaning of the reactor.

High ion and neutral fluxes to a substrate without high ion energies can be generated for an a-Si:H PECVD process for example, therefore allowing higher deposition rates while conserving film quality.

With the method according to the present invention, it is henceforth possible to use a different process regime in nc-Si:H or μc-Si:H PECVD. This regime consists of lower pressure, less dilute (SiH4/H2) gas mixtures and higher plasma density, which has been shown to give increased deposition rates and less dust-formation in reactors, compared to the standard method.

Advantageously, the ion energy distribution function at the substrate is controlled by adjusting the relative duration between the high plateau and the low plateau of the trapezoidal waveform.

According to the invention, the plasma density can be controlled by adjusting the repetition rate of the trapezoidal waveform.

Advantageously, the plasma density and/or the ion energy distribution function at the substrate can also be further controlled by adjusting the voltage amplitude of the trapezoidal waveform.

The duration of the ramp-up and the duration of the ramp-down may be between 1-10 ns, preferably between 5-10 ns. The present invention discloses the use of a linear ramp, rather than a prior art sinusoidal increase, which optimises the power delivered to the electrons for a given amplitude.

Conveniently, the amplitude of the trapezoidal waveform is between 50-1000v.

The pulse repetition of the RF voltage also contributes in determination of the plasma density. Preferably, the duration of period of the trapezoidal waveform is between 10-1000 ns.

The duration of the high plateau and the low plateau of the trapezoidal waveform are varied continuously or discretely in order to achieve, averaged over many periods, any arbitrary effective ion energy distribution function at the substrate.

According to the invention, the proportion at each electrode of the DC sheath voltages between the plasma and electrodes is determined by adjusting the relative duration of the high plateau and the low plateau of the trapezoidal waveform.

According to a preferred embodiment of the present invention, the trapezoidal waveform at the electrode surface may be obtained by using a corrective feedback of the RF voltage waveform. Therefore, the waveform of the signal applied to the electrode is precisely determined.

The method according to the present invention has the advantage that the substrate may be disposed on the powered electrode or on the unpowered electrode.

According to the present invention, either the powered electrode or the powered electrode may be bombarded, reducing deposition where it is not wanted and therefore enhancing the supply of deposition precursors to the substrate.

In accordance with another aspect of the present invention, the growth of thin films on the substrate is adjusted between amorphous and nano- or micro-crystalline growth by applying the trapezoidal waveform and a complement of said trapezoidal waveform. Advantageously, it was observed that the trapezoidal waveform according to the present invention allows the deposited film structure to be switched from amorphous to microcrystalline, simply by changing from the original waveform to its complement.

Advantageously, the capacitively coupled reactive plasma reactor may be a large-area symmetric plasma reactor. Such a reactor is notably used in production of photovoltaic solar cell.

According to another aspect of the present invention, there is provided a system comprising a waveform generator to excite at least one electrode of a capacitively coupled reactive plasma reactor containing a substrate. This waveform generator is configured to:
excite the plasma reactor by applying a RF voltage with a trapezoidal waveform, and
adjust the duration of the ramp-up and/or the duration of the ramp-down of the trapezoidal waveform, the voltage amplitude and the repetition frequency in order to control the plasma density and fluxes of ionic and neutral species to a substrate.

The foregoing and other objects, features and advantages of the present invention will become more readily apparent from the following detailed description of a preferred embodiment of the invention which proceeds with reference to the accompanying drawings.

DETAILED DESCRIPTION

Figure 1:
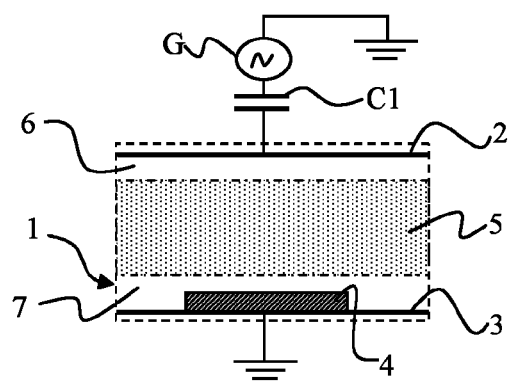
FIG. 1 is a schematic of a capacitively-coupled plasma reactor excited by a waveform generator according to the present invention.

A simplified schematic of a capacitively-coupled plasma reactor, shown in FIG. 1, comprises a processing chamber 1, a powered electrode 2, and an unpowered electrode 3. Radio-frequency power from a generator G is applied through a blocking capacitor C1 to the powered electrode 2. The substrate 4 to be processed can be placed either on the powered electrode 2 or on the grounded or unpowered electrode 3. Plasma 5 is generated inside the volume of processing chamber 1 between the powered electrode 2 and the substrate 4.

In all plasma reactors so-called sheaths 6 and 7 form between the bulk plasma and all the surfaces surrounding it (the electrodes, substrates and processing chamber walls). Sheaths have a high impedance, which is principally capacitive. It is the sheath impedance that limits the current flowing through the plasma 5, and therefore determines the power absorbed by the electrons. The majority of the RF voltage applied across the electrodes is divided between the two sheaths 6 and 7 in front of the respective electrodes. The central plasma has a high conductivity and therefore only supports small voltage differences. Therefore the sheaths contain large RF electric fields. The non-linear characteristic of the sheaths rectifies this RF field to produce a large DC electric field causing positively-charged ions to be accelerated away from the plasma and to strike the reactor surfaces with high energy.

If one electrode is much smaller than the other, the sheath in front of it will have a smaller capacitance. As the current through the system is conserved, the same RF current must flow through both sheaths, therefore the RF voltage will be bigger across the sheath in front of the smaller electrode. The conductance current through a sheath is a non-linear function of the voltage across it, there is a rectifying effect and the blocking capacitor will charge up. This is the so-called DC bias effect, and leads to higher energy ion bombardment at the smaller electrode, and lower energy ions at the large electrode.

However, in large area reactors the two electrodes are necessarily of very similar size, and the RF voltage is generally divided almost equally between the two sheaths 6 and 7, providing equivalent energy ion bombardment to both sides, ie to both the substrate and the opposite electrode.

Figure 2:
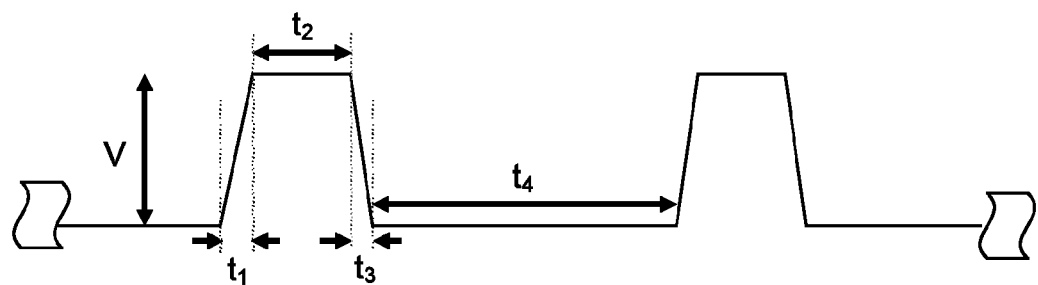
FIG. 2 is a graph illustrating the trapezoidal waveform according to the present invention.

The technique of the present invention replaces the sinusoidal signals with a variable trapezoidal waveform applied to the electrodes, as shown in FIG. 2.

A trapezoidal waveform comprises a ramp-up during $t_1$, a high plateau during $t_2$, a ramp-down during $t_3$, and a low plateau during $t_4$.

The total voltage across the plasma and therefore the sum of the voltages across the two sheaths is given by the amplitude V, typically 50-1000V. Heating of electrons, which controls the ionization and therefore the plasma density and fluxes to the substrate, occurs during the ramp-up and ramp-down times $t_1$ and $t_3$ typically 1-10 ns. The faster the slew rate (V/$t_1$ or $t_3$), the greater the current allowed through the capacitive sheaths 6 and 7, the more efficiently the electrons will be heated and the denser the plasma. In order to prevent standing-wave effects and non-uniformity, the optimal time may be in the range 5-10 ns. The plasma density is also determined by the overall pulse repetition rate, $1/(t_1+t_2+t_3+t_4)$. Preferably, $t_1+t_2+t_3+t_4$ is in the range 20-100 ns.

The division of V across the two sheaths 6 and 7 is determined by the relative duration of the constant-voltage periods, t2 and t4. If t1 is negligible (for example <5 ns) and t4 is long (for example 100 ns), the majority of the voltage develops across the sheath in front of the powered electrode, and therefore this electrode receives high energy ions, and the opposite electrode has minimum-energy ion bombardment. Therefore if the substrate is on the unpowered electrode, optimal thin film Si deposition conditions could be achieved: high flux of ions and neutral film precursors but low energy.

Conversely, if the substrate is on the powered electrode, it receives high energy ions. Such conditions are more suitable for etching applications in general, although also for some types of thin film deposition that require greater ion-bombardment such as hydrogenated amorphous germanium. Indeed, varying t2 and t4 allows complete control of the ion energy at the substrate. If t2 and t4 are equal then the waveform is symmetrical and the two sheaths are equal. More complex variants can be imagined in which t2 and t4 are varied continuously on the timescale of the process in order to achieve, averaged over many periods, any arbitrary effective Ion Energy Distribution Function (IEDF) at the substrate which may be considered optimal for the process in question.

Figure 3:
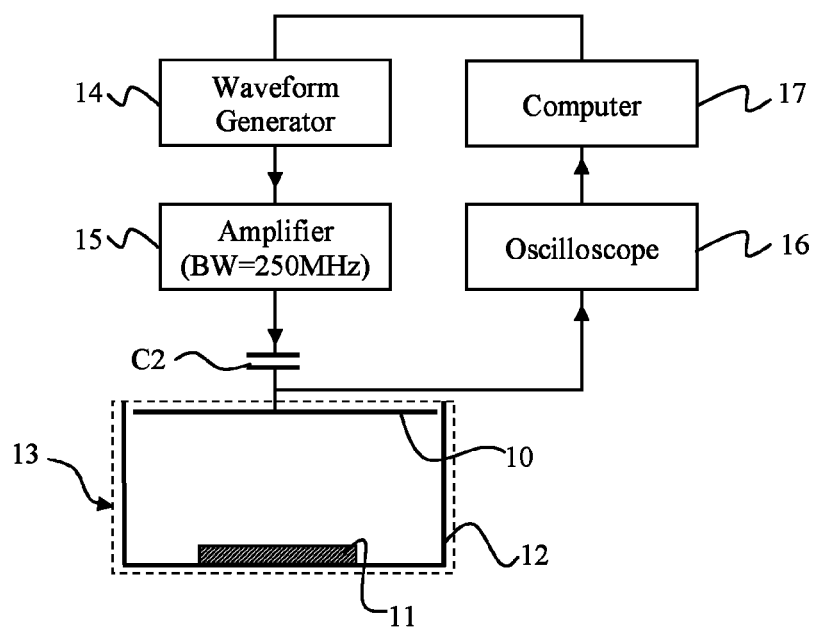
FIG. 3 is a diagram of tailored excitation waveform control system comprising a corrective feedback system.

FIG. 3 concerns an embodiment of a plasma reactor system allowing waveform tailoring during deposition of thin films. Such an embodiment would be of utility when implemented, for example, for the PECVD of nc-Si:H in large area devices such as thin film solar cells, particularly when considering the film thicknesses required for practical photovoltaic devices. When deposited by the standard radio-frequency (RF) PECVD technique, the deposition rate of nc-Si:H, is limited by the fact that for a greater deposition rate, a higher injected power into the plasma is required, causing an increase ion bombardment (IB) of the growth surface, and decreasing the material quality.

The present invention allows to reduce the sheath potential at the substrate, control the substrate ion bombardment energy during PECVD of nc-Si:H, and thus either enhance or suppress nanocrystalline growth.

An embodiment of the principle is realised using the experimental setup shown in FIG. 3. The substrate 11 is on the unpowered electrode 12 which also constitutes walls of the processing chamber 13, except on the powered electrode side.

FIG. 3 illustrates a powered electrode 10 with a diameter of 100 mm, and an inter-electrode distance of 19 mm, resulting in an areal electrode asymmetry of $A_{substrate+walls}/A_{electrode}$ of approximately 2.25. This asymmetry suppresses the ion bombardment energy at the substrate through unequal distribution of the sheaths between the powered electrode 10 and the walls+unpowered electrode. The electrical asymmetry effect according to the present invention would be even more effective on large-area and thus symmetrical reactors. A gas flow rate mixture of Ar=35 sccm, $SiF_4$=1.4 sccm, and $H_2$=1.4 sccm is used. This gas chemistry is chosen as it is known to produce nc-Si:H material with a very high crystalline volume fraction over a wide range of deposition conditions, with a deposition rate of 2.5 A/s for example.

The substrate and electrode temperatures are 150° C. and 100° C., respectively, and a pulse repetition rate of 15 MHz are used.

Figure 4A:
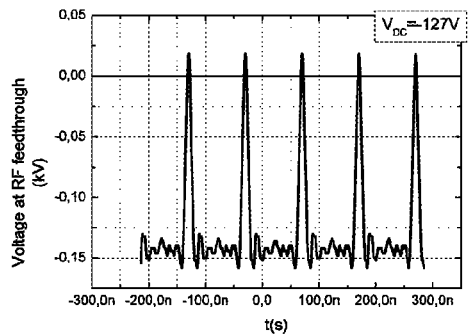
FIGS. 4a and 4b are graphs illustrating actual voltage waveforms and their complements, realised in a test reactor according to the present invention.
Figure 4B:
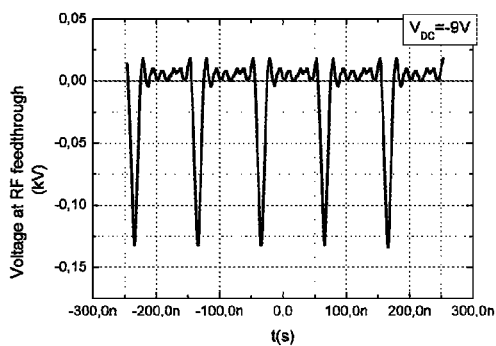

To produce the desired waveforms at the RF electrode, a corrective feedback system is used. The ideally trapezoidal waveform is generated by a Tektronix AFG3101 programmable waveform generator 14, and after amplification by the amplifier 15 (Amplifier Research Model 150A220, 150 W) and propagation through a coupling capacitor $C_2$, the voltage waveform present at the RF feedthrough is measured using a high-voltage probe and an oscilloscope 16. The Fourier transform of this signal is performed and compared to the desired signal, thus allowing the calculation by the computer 17 of the original signal necessary to produce either voltage "peaks" or "troughs" at the powered electrode. Typical voltage waveforms after correction are presented in FIGS. 4a and 4b for corrections resulting in both "peaks" (FIG. 4a) and "troughs" (FIG. 4b), respectively. The experimental trapezoidal waveforms obtained in FIG. 4a (4b) present a duration of the high (low) plateau tending to zero.

The DC bias appearing on the RF electrode is also indicated, and indicates the enormous shift possible in the distribution of the sheaths.

Voltage "peaks" concern a waveform in which the duration of the high plateau is smaller than the duration of the low plateau. Voltage "troughs" waveform is a complement of a voltage "peaks" waveform.

A dramatic shift in the DC bias potential at the powered electrode is observed when simply inverting the voltage waveform from "peaks" to "troughs", indicating an asymmetric distribution of the sheath voltage. By enhancing or suppressing the ion-bombardment energy at the substrate surface, (using "troughs" or "peaks", respectively) the growth of thin silicon films by plasma-enhanced chemical vapor deposition can be switched between amorphous and nanocrystalline growth for high and low ion bombardment energies, respectively. The change in growth mode can be observed in-situ using spectroscopic ellipsometry. This effect can be observed at pressures sufficiently low that the collisional reduction in average ion bombardment energy is not sufficient to allow nanocrystalline growth (<100 mTorr).

Figure 5A:
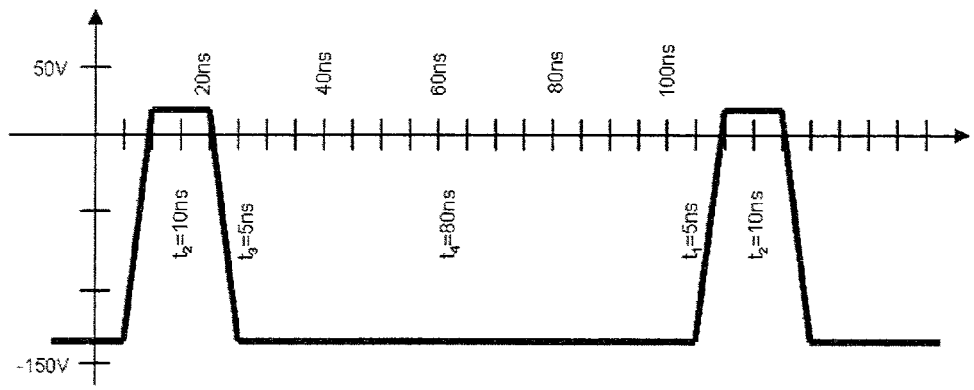
FIGS. 5a and 5b are graphs illustrating idealised example of voltage waveforms and their complements according to the present invention.
Figure 5B:
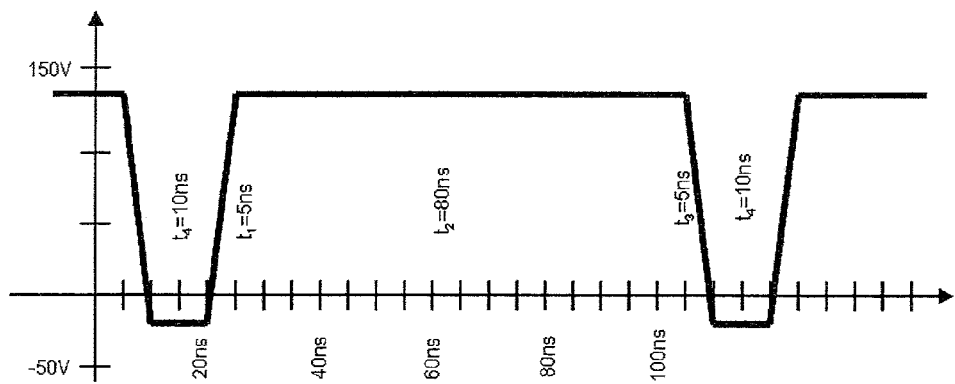

FIGS. 5a and 5b concern idealised examples of voltage waveforms that may appear at the RF electrode. The repetition rate of both waveforms is 10 MHz. The example of FIG. 5a shows a waveform with a peak-to-peak voltage amplitude of 150V, a rise time $t_1$ of 5 ns, an upper voltage level plateau time of $t_2$=10 ns, a fall time $t_3$ of 5 ns, and a lower voltage level plateau of $t_4$=80 ns. In a symmetrical reactor, such a waveform would result in a greater proportion of the sheath voltage appearing at the RF-powered electrode (for example electrode 2 on FIG. 1), and a reduced ion bombardment energy at the substrate holder (for example unpowered electrode 3 on FIG. 1) compared to a sinusoidal excitation at the same frequency and voltage amplitude. The example of FIG. 5b shows a waveform with peak to peak voltage amplitude of 150V, a rise time $t_1$ of 5 ns, an upper voltage level plateau time of $t_2$=80 ns, a fall time $t_3$ of 5 ns, and a lower voltage level plateau of $t_4$=10 ns. In a symmetrical reactor, such a waveform would result in a greater proportion of the sheath voltage appearing at the substrate holder (for example unpowered electrode 3 on FIG. 1), thus increasing the ion bombardment energy relative to a sinusoidal excitation at the same frequency and voltage amplitude.

The present invention relates to a new way to excite plasma reactors for processing of large area substrates. The conventional sinusoidal (single or multiple frequency) radiofrequency voltage signal is replaced with a trapezoidal waveform consisting of fast rising and dropping ramps (duration 1-10 ns, amplitude 50-1000V) separated by constant voltage periods (20-100 ns). This waveform allows both optimal plasma heating (control of the plasma density, and therefore the flux of reactive neutrals and ions to the processed substrate) and optimal control of the ion energy distribution function (IEDF) at the substrate by varying the waveform shape. In particular, it will allow plasma processing of substrates with high ion and neutral fluxes but minimal energy, allowing high rate PECVD of high-quality silicon thin films for photovoltaic solar cell manufacture. Control of the IEDF will also benefit large area plasma etching applications, such as in integrated microelectronic circuit and flat panel display manufacture.

Numerous variations and modifications will become apparent to those skilled in the art once the above disclosure is fully appreciated. It is intended that the following claims be interpreted to embrace all such variations and modifications.

The invention claimed is:

1. A method for exciting at least one electrode of a capacitively coupled reactive plasma reactor containing a substrate, comprising:
   the electrode is excited by applying a RF voltage with a trapezoidal waveform including sections of a ramp-up, a high plateau, a ramp-down, and a low plateau, each section having a predetermined time period, and
   the plasma density and fluxes of ionic and neutral species to a substrate are controlled by adjusting the duration of the ramp-up and/or the duration of the ramp-down of the trapezoidal waveform,
   wherein the duration of period of the trapezoidal waveform is between 10-1000 ns.

2. The method according to claim 1, characterized in that the ion energy distribution function at the substrate is controlled by adjusting the relative duration between the high plateau and the low plateau of the trapezoidal waveform.

3. The method according to claim 1, characterized in that the plasma density is further controlled by adjusting the repetition rate of the trapezoidal waveform.

4. The method according to claim 1, characterized in that the plasma density and/or ion energy distribution function at the substrate is further controlled by adjusting the voltage amplitude of the trapezoidal waveform.

5. The method according to claim 1, characterized in that growth of thin films on the substrate is adjusted between amorphous and nanocrystalline growth by applying the trapezoidal waveform and a complement of said trapezoidal waveform.

6. The method according to claim 1, characterized in that the duration of the ramp-up and the duration of the ramp-down are between 1-10 ns.

7. The method according to claim 6, characterized in that the duration of the ramp-up and the duration of the ramp-down are between 5-10 ns.

8. The method according to claim 1, characterized in that the amplitude of the trapezoidal waveform is between 50-1000 v.

9. The method according to claim 1, characterized in that the duration of a high plateau and a low plateau of the trapezoidal waveform are varied continuously or discretely in order to achieve, averaged over many periods, any arbitrary effective ion energy distribution function at the substrate, wherein decreasing a ratio of the duration of the high plateau relative to the duration of the low plateau increases the ion bombardment energy at the powered electrode or a substrate placed upon it, and lowers the ion energy at the grounded electrode; and increasing the ratio of the duration of the high plateau relative to the duration of the low plateau decreases the ion bombardment energy at the powered electrode or a substrate placed upon it, and increases the ion energy at the grounded electrode.

10. The method according to claim 1, characterized in that the proportion at each electrode of DC sheath voltages between the plasma and electrodes is defined by a difference between a high plateau and a low plateau of the trapezoidal waveform, wherein decreasing a ratio of the duration of the high plateau relative to the duration of the low plateau increases the DC sheath voltage between the plasma and the powered electrode or a substrate placed upon it, and decreases DC sheath voltage between the plasma and grounded electrode; and increasing the ratio of the duration of the high plateau relative to the duration of the low plateau decreases the DC sheath voltage between the plasma and the powered electrode or a substrate placed upon it, and increases DC sheath voltage between the plasma and grounded electrode.

11. The method according to claim 1, characterized in that the trapezoidal waveform at the electrode surface is obtained by using a corrective feedback of the RF voltage waveform.

12. The method according to claim 1, characterized in that the substrate is on the powered electrode or on the unpowered electrode.

13. The method according to claim 1, characterized in that the capacitively coupled reactive plasma reactor is a large-area symmetric plasma reactor.

14. A method for exciting at least one electrode of a capacitively coupled reactive plasma reactor containing a substrate, comprising:
   the electrode is excited by applying a RF voltage with a trapezoidal waveform including sections of a ramp-up, a high plateau, a ramp-down, and a low plateau, each section having a predetermined time period, and
   the plasma density and fluxes of ionic and neutral species to a substrate are controlled by adjusting the duration of the ramp-up and/or the duration of the ramp-down of the trapezoidal waveform,
   wherein the duration of the ramp-up and the duration of the ramp-down are between 1-10 ns, and an overall time period of the trapezoidal waveform is between 20-100 ns.

* * * * *